United States Patent
Hong et al.

(10) Patent No.: US 9,473,089 B2
(45) Date of Patent: Oct. 18, 2016

(54) HYBRID POWER MODULE

(71) Applicant: MediaTek Inc., Hsin-Chu (TW)

(72) Inventors: Hao-Ping Hong, Jhubei (TW); Hung-I Wang, Zhudong Township, Hsinchu County (TW); Chun-Yen Tseng, Hsinchu (TW); Yen-Hsun Hsu, Hengshan Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/272,615

(22) Filed: May 8, 2014

(65) Prior Publication Data

US 2015/0326186 A1 Nov. 12, 2015

(51) Int. Cl.
*H03F 3/04* (2006.01)
*H03F 3/24* (2006.01)
*H03F 1/02* (2006.01)
*H03F 3/19* (2006.01)
*H03F 3/21* (2006.01)
*H03F 1/30* (2006.01)

(52) U.S. Cl.
CPC ............ *H03F 3/245* (2013.01); *H03F 1/0227* (2013.01); *H03F 1/0238* (2013.01); *H03F 1/30* (2013.01); *H03F 3/19* (2013.01); *H03F 3/21* (2013.01); *H03F 2200/102* (2013.01); *H03F 2200/432* (2013.01); *H03F 2200/451* (2013.01); *H03F 2200/459* (2013.01)

(58) Field of Classification Search
CPC ............................ H03F 1/0222; H03F 1/0227
USPC ......................................... 330/127, 136, 297
See application file for complete search history.

(56) References Cited

U.S. PATENT DOCUMENTS

| | | | |
|---|---|---|---|
| 7,653,366 B2 | 1/2010 | Grigore | |
| 8,587,271 B2 | 11/2013 | Kanbe et al. | |
| 8,803,605 B2* | 8/2014 | Fowers et al. | ............... 330/136 |

* cited by examiner

*Primary Examiner* — Steven J Mottola
(74) *Attorney, Agent, or Firm* — McClure, Qualey & Rodack, LLP (57) ABSTRACT

A hybrid power module for supplying a power to a power amplifier is provided. The hybrid power module includes a DC-DC converter and a linear regulator. The DC-DC converter provides a first current to the power amplifier via a first inductor according to an operating frequency and an envelope tracking signal. The linear regulator provides a second current to the power amplifier via a first capacitor according to the envelope tracking signal. A switch-mode power supply (SMPS) ripple voltage caused by the DC-DC converter is reduced by the linear regulator.

8 Claims, 10 Drawing Sheets

HYBRID POWER MODULE

BACKGROUND OF THE INVENTION

1. Field of the Invention

The invention relates to a hybrid power module, and more particularly, to a hybrid power module of a power amplifier.

2. Description of the Related Art

In amplifier applications, efficiency and linearity are major considerations. For current wireless communication systems, a radio frequency (RF) power amplifier (PA) consumes a majority of the power for portable products. Consequently, a conventional method to extend operation and standby time of wireless communication systems is to improve the efficiency of the power amplifier.

With the spectrum available for radio communication systems becoming more and more limited, this in turn is forcing the development of spectrally-efficient linear modulation schemes. Since the envelopes of a number of these linear modulation schemes fluctuate, the level of the average power, which is being delivered to the antenna, is significantly lower than the level of the maximum power, which results in poor efficiency of the power amplifier.

Linear modulation schemes require linear amplification of the modulated signal in order to minimize undesired out-of-band emissions from spectral re-growth. However, the active devices used within a typical RF amplifying device are inherently non-linear by nature. Only when a small portion of the consumed DC power is transformed into RF power, will the transfer function of the amplifying device be approximated by a straight line, i.e. as in an ideal linear amplifier case. This mode of operation renders the efficiency of the DC to RF power conversion to be low, which is unacceptable for portable (subscriber) wireless communication units.

The emphasis for portable (subscriber) equipment is to increase battery life. To achieve both linearity and efficiency, the so-called linearization techniques are used to improve the linearity of the more efficient amplifier classes.

To help overcome such efficiency and linearity issues, a number of solutions have been proposed. One technique used relates to modulating the power amplifier supply voltage to match the envelope of the radio frequency waveform being transmitted by the RF power amplifier. Envelope modulation requires a feedback signal from the power amplifier supply to one of the control ports of the amplifier. Proposed solutions that utilize envelope modulation include envelope elimination and restoration (EER), and envelope tracking (ET). Both of these approaches require the application of a wideband supply signal to the supply port of the PA.

BRIEF SUMMARY OF THE INVENTION

Hybrid power modules for providing a power to a power amplifier are provided. An embodiment of a hybrid power module for supplying a power to a power amplifier is provided. The hybrid power module comprises: a DC-DC converter, providing a first current to the power amplifier via a first inductor according to an operating frequency and an envelope tracking signal; and a linear regulator, providing a second current to the power amplifier via a first capacitor according to the envelope tracking signal, wherein a switch-mode power supply (SMPS) ripple voltage caused by the DC-DC converter is reduced by the linear regulator.

Furthermore, another embodiment of a hybrid power module for providing a power to a power amplifier is provided. The hybrid power module comprises a DC-DC converter, providing a first current to the power amplifier via a first inductor according to an operating frequency and a first signal; and a linear regulator, providing a second current to the power amplifier via a first capacitor and providing the first signal to the DC-DC converter according to an envelope tracking signal, wherein a switch-mode power supply (SMPS) ripple voltage caused by the DC-DC converter is reduced by the linear regulator.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
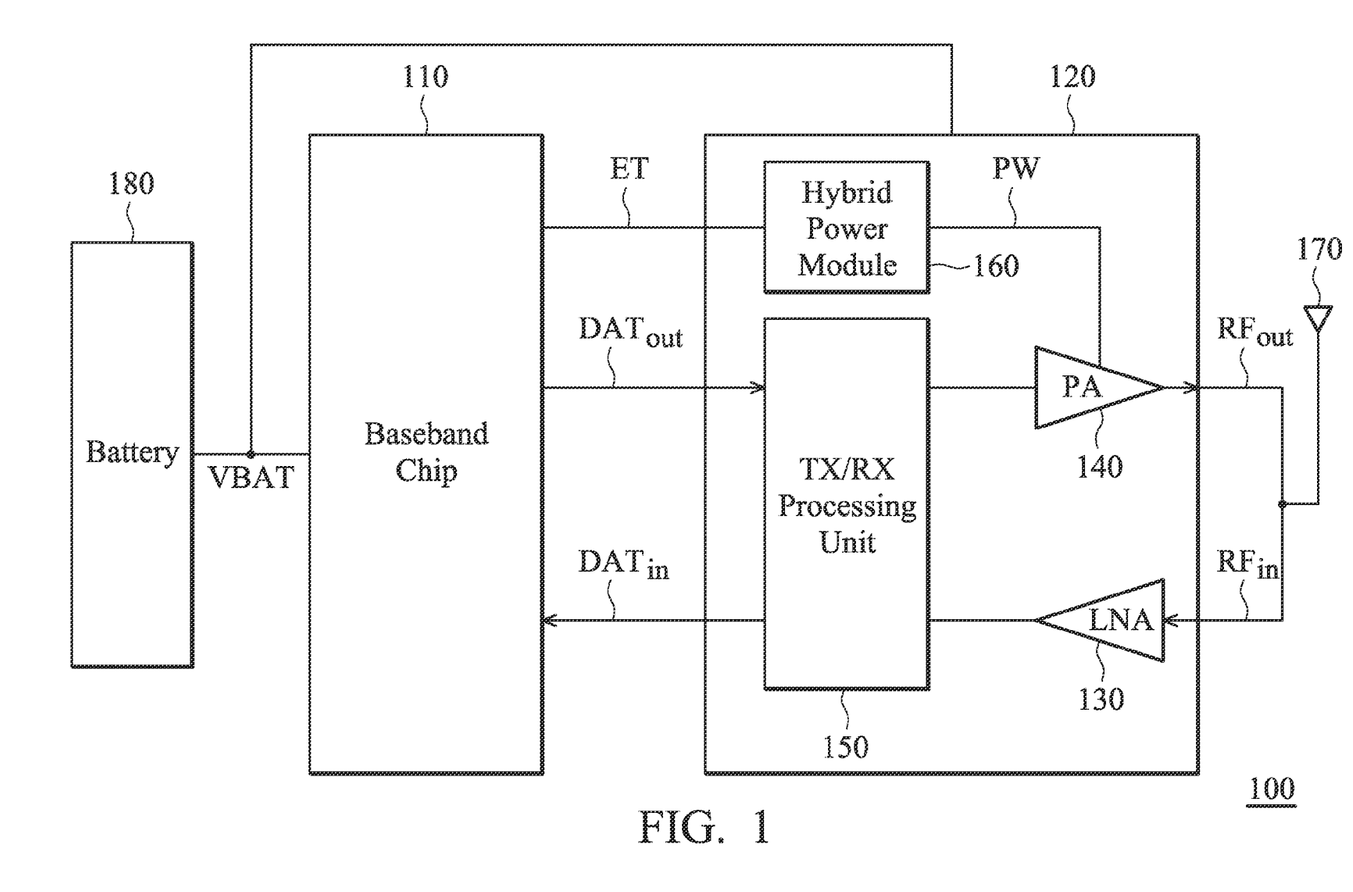
FIG. 1 shows a block diagram illustrating a portable device according to an embodiment of the invention.

FIG. 1 shows a block diagram illustrating a portable device 100 according to an embodiment of the invention. The portable device 100 comprises a baseband chip 110, a radio frequency (RF) module 120, an antenna 170 and a battery 180. The battery 180 provides a voltage VBAT to the baseband chip 110 and the RF module 120. In one embodiment, the portable device 100 further comprises a power managing module for providing various operating voltages to the baseband chip 110 and the RF module 120 according to the voltage VBAT of the battery 180. The RF module 120 is coupled between the baseband chip 110 and the antenna 170, which comprises a low noise amplifier (LNA) 130, a power amplifier (PA) 140, a TX/RX processing unit 150 and a hybrid power module 160. The TX/RX processing unit 150 receives and modulates the data DATout from the baseband chip 110, so as to provide the RF signal RFout to the antenna 170 via the power amplifier 140 for transmitting data packets to another wireless device or a base station. Simultaneously, the baseband chip 110 further provides an envelope signal ET to the hybrid power module 160. The hybrid power module 160 supplies a power PW to the power amplifier 140 according to the envelope signal ET and the voltage VBAT of the battery 180. In general, the receiving wireless device will send back acknowledge (ACK) messages in response to the data packets transmitted by the transmitting wireless device. Therefore, the TX/RX processing unit 150 of the transmitting wireless device will receive and demodulate the RF signal RFin corresponding to the ACK message via the LNA 130 and the antenna 170, so as to provide the data DATin to the baseband chip 110. The baseband chip 110 can monitor the RF signal RFout by detecting the data DATin corresponding to the RF signal RFin, wherein the RF signal RFin comprises a feedback component of the RF signal RFout.

Figure 2:
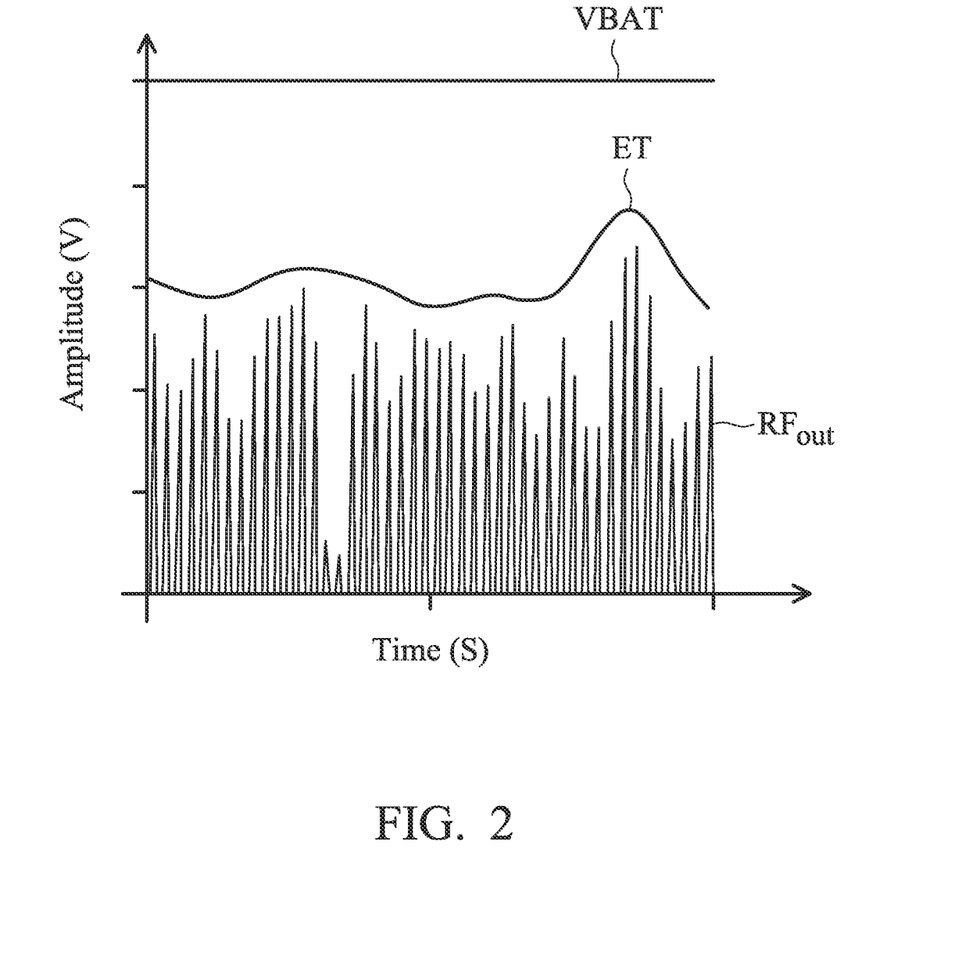
FIG. 2 shows a schematic diagram illustrating a relationship between the envelope signal ET, the voltage VBAT and the RF signal $RF_{out}$ of FIG. 1.

FIG. 2 shows a schematic diagram illustrating a relationship between the envelope signal ET, the voltage VBAT and the RF signal $RF_{out}$ of FIG. 1. Referring to FIG. 1 and FIG. 2, the voltage VBAT from the battery 180 is substantially maintained at a fixed voltage level during a time period. The baseband chip 110 detects the data $DAT_{in}$ to monitor a variation of the RF signal $RF_{out}$. According to the variation of the RF signal $RF_{out}$, the baseband chip 110 provides the envelope signal ET to the RF module 120.

Figure 3:
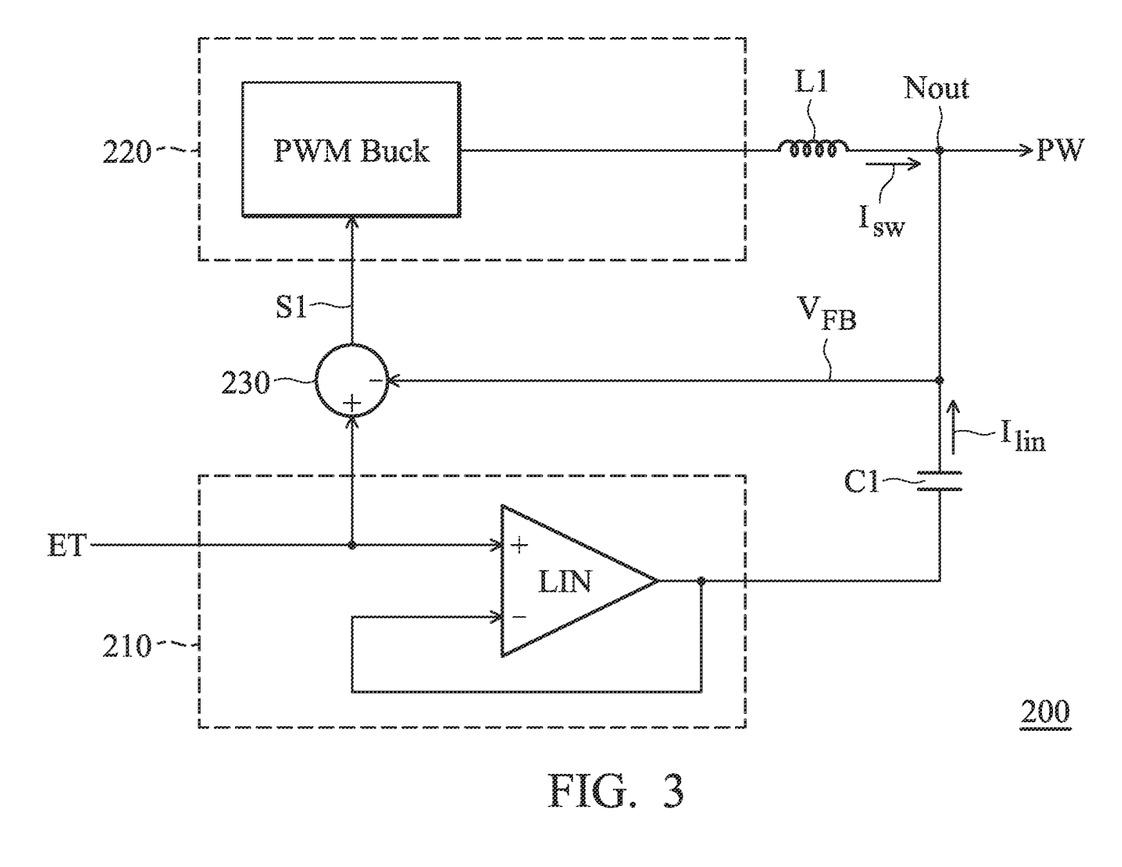
FIG. 3 shows a hybrid power module for supplying power to a power amplifier according to an embodiment of the invention.
Figure 4:
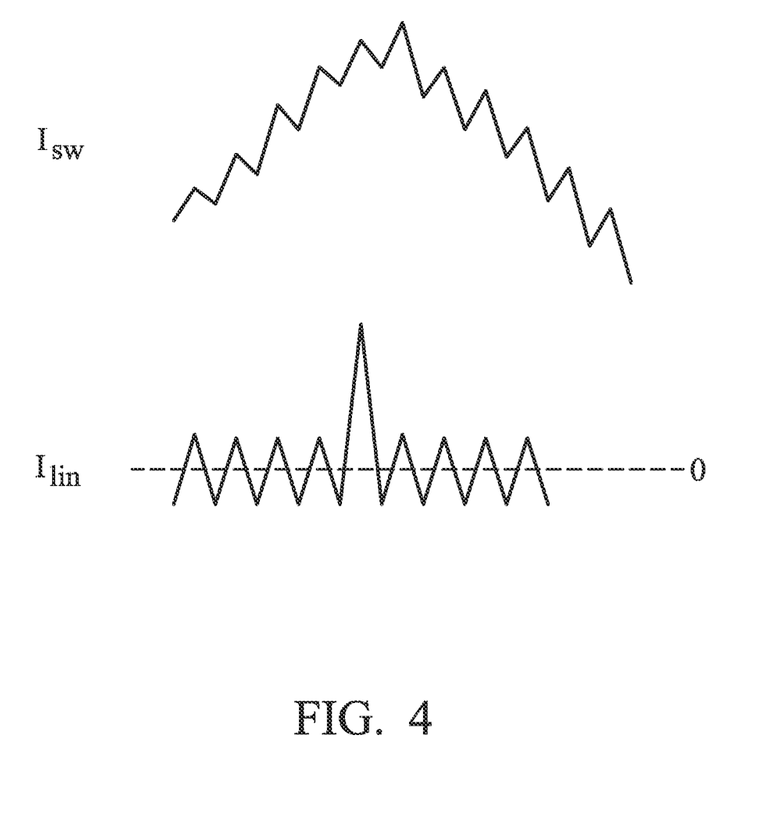
FIG. 4 shows an example illustrating the currents $I_{lin}$ and $I_{sw}$ of FIG. 3.

FIG. 3 shows a hybrid power module 200 for supplying power to a power amplifier (e.g. 140 of FIG. 1) according to an embodiment of the invention. The hybrid power module 200 comprises a linear regulator 210, a DC-DC converter 220, a subtractor 230, an inductor L1 and a capacitor C1. The linear regulator 210 is capable of eliminating the switch-mode power supply (SMPS) ripple voltages caused by the DC-DC converter 220, i.e. provides an AC ground, wherein the hybrid power module 200 provides the power PW to the power amplifier as a supply power. The linear regulator 210 provides a current $I_{lin}$ to a node Nout via the capacitor C1 according to the envelope signal ET and the voltage VBAT from the battery 180, as shown in FIG. 4. The subtractor 230 subtracts a feedback signal $V_{FB}$ corresponding to the power PW from the envelope tracking signal ET, to provide a signal S1 to the DC-DC converter 220. The DC-DC converter 220 is a high switching frequency DC-DC converter, which is capable of responding to load variations. In the embodiment, the DC-DC converter 220 is a pulse width modulation buck converter. The DC-DC converter 220 provides a current $I_{sw}$ to the node Nout via the inductor L1 according to the signal S1 and the voltage VBAT from the battery 180, as shown in FIG. 4. Thus, the power PW formed by the current $I_{lin}$, the current $I_{sw}$ and a loading of the power amplifier are provided to the power amplifier. It is to be noted a switch-mode power supply (SMPS) ripple voltage caused by an operating frequency of the DC-DC converter 220 (i.e. the switching frequency) is reduced by the linear regulator 210. Furthermore, the linear regulator 210 provides an AC ground for the DC-DC converter 220 via the capacitor C1.

Figure 5:
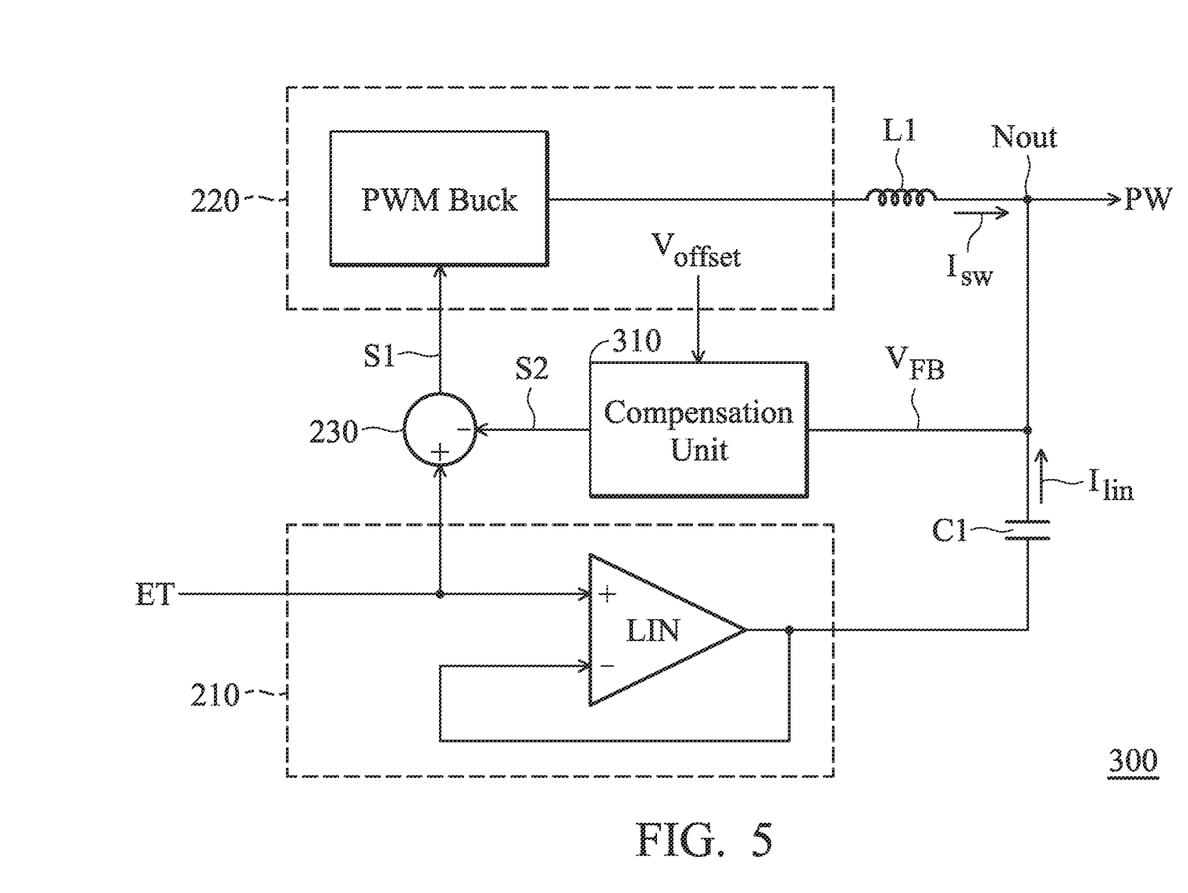
FIG. 5 shows a hybrid power module for supplying power to a power amplifier according to another embodiment of the invention.

FIG. 5 shows a hybrid power module 300 for supplying power to a power amplifier (e.g. 140 of FIG. 1) according to another embodiment of the invention. Compared to the hybrid power module 200 of FIG. 3, the hybrid power module 300 further comprises a compensation unit 310 coupled between the subtractor 230 and the node Nout. The compensation unit 310 receives the feedback signal $V_{FB}$ and adds an offset voltage $V_{offset}$ into the feedback signal $V_{FB}$ to generate a signal S2. Thus, the subtractor 230 subtracts the signal S2 from the envelope tracking signal ET, to provide the signal S1 to the DC-DC converter 220. Next, the DC-DC converter 220 provides a current $I_{sw}$ to the node Nout via the inductor L1 according to the signal S1. Thus, the power PW corresponding to the current $I_{lin}$ and the current $I_{sw}$ are provided to the power amplifier. In the embodiment, the offset voltage $V_{offset}$ is used to pump a voltage of the power PW for high voltage patterns.

Figure 6:
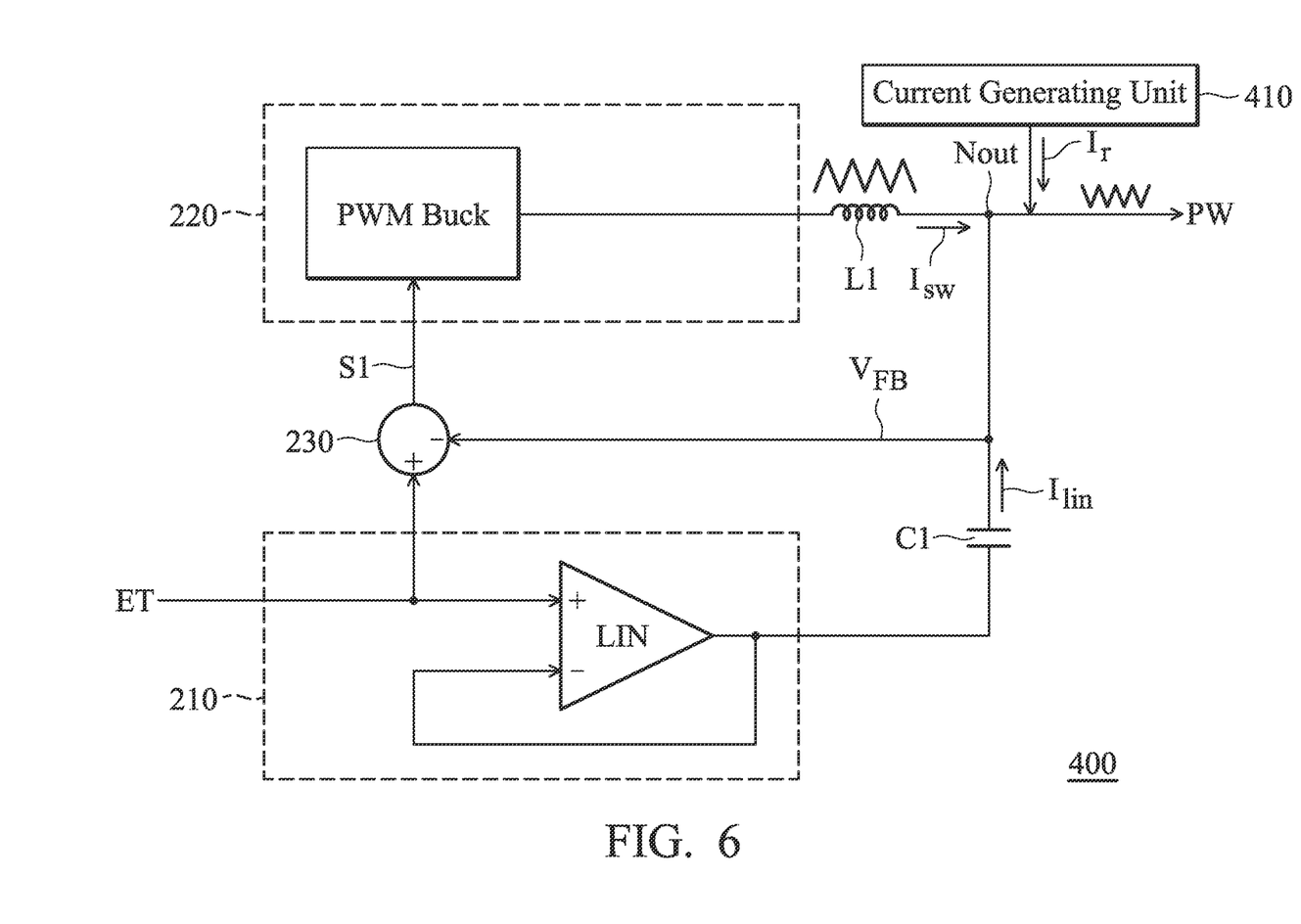
FIG. 6 shows a hybrid power module for supplying power to a power amplifier according to another embodiment of the invention.

FIG. 6 shows a hybrid power module 400 for supplying power to a power amplifier (e.g. 140 of FIG. 1) according to another embodiment of the invention. Compared to the hybrid power module 200 of FIG. 3, the hybrid power module 400 further comprises a current generating unit 410 coupled to the node Nout for providing a current Ir to the node Nout, wherein the current $I_r$ is out of phase with the current $I_{sw}$. Thus, the current $I_{sw}$ is reduced by the current $I_r$, so as to diminish a loading effect caused by the linear regulator 210 for the power PW.

Figure 7:
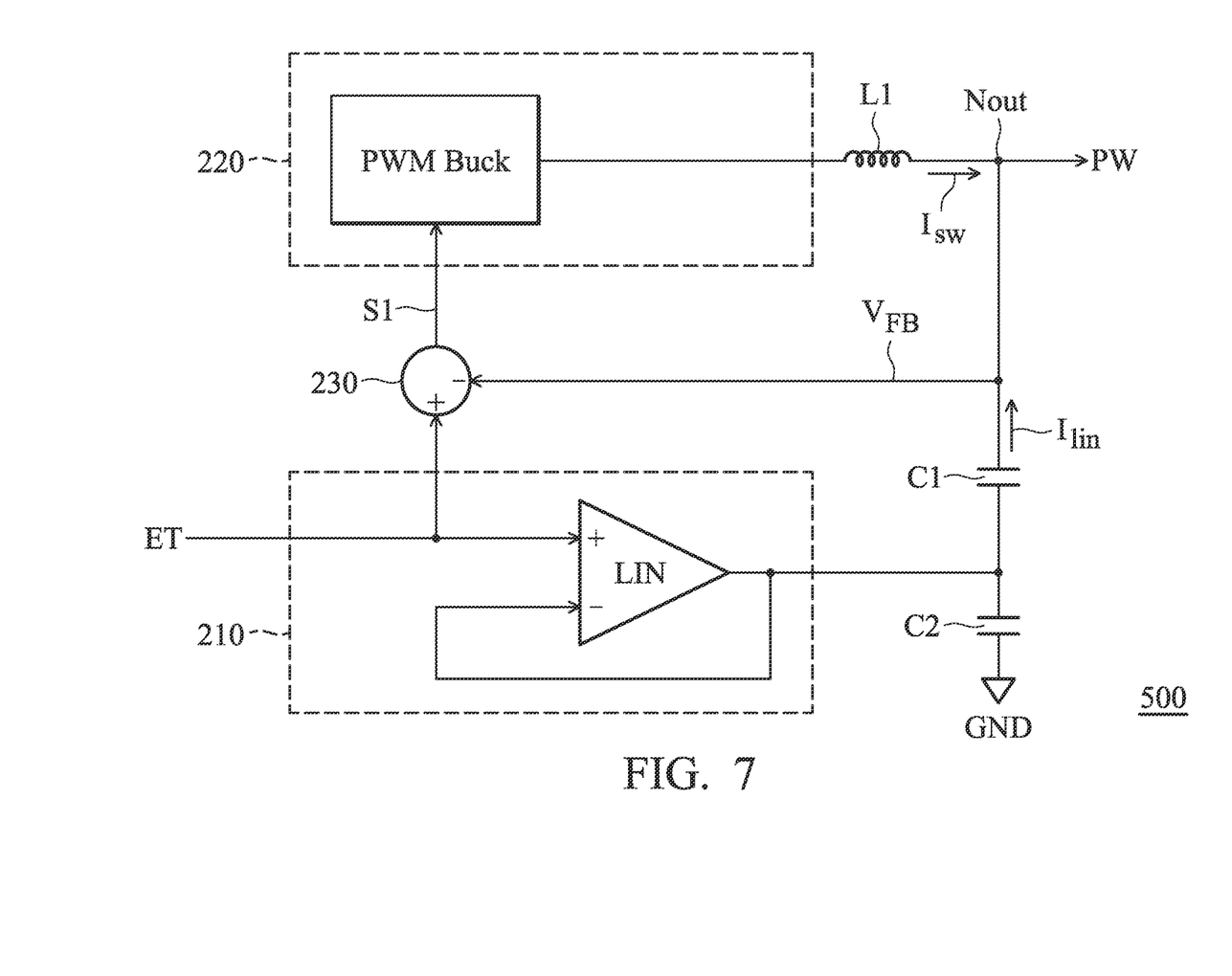
FIG. 7 shows a hybrid power module for supplying power to a power amplifier according to another embodiment of the invention.

FIG. 7 shows a hybrid power module 500 for supplying power to a power amplifier (e.g. 140 of FIG. 1) according to another embodiment of the invention. Compared to the hybrid power module 200 of FIG. 3, the hybrid power module 500 further comprises a capacitor C2 coupled between the capacitor C1 and a ground GND. In the embodiment, the capacitor C2 is used to achieve low impedance for the AC ground provided by the linear regulator 210.

Figure 8:
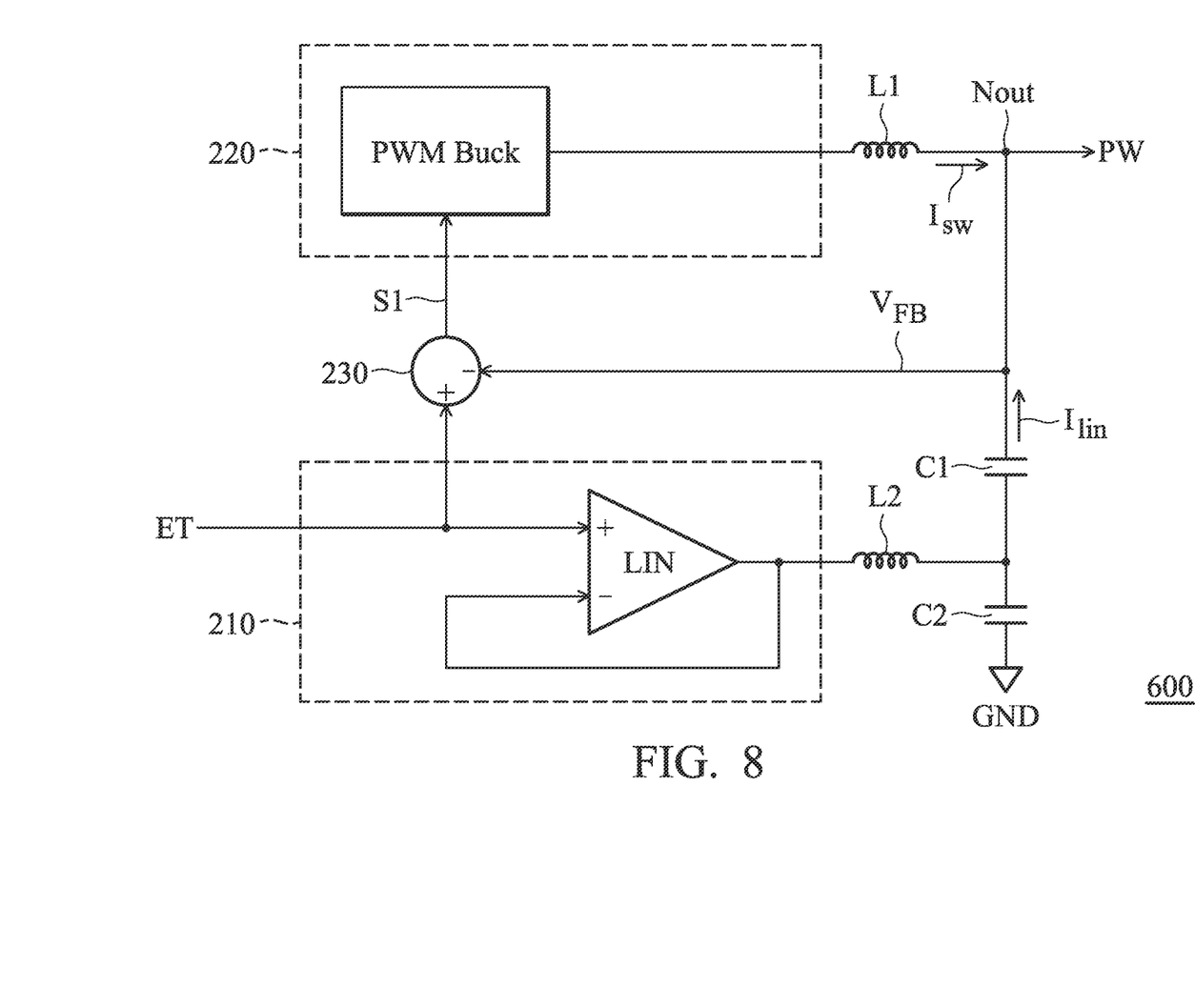
FIG. 8 shows a hybrid power module for supplying power to a power amplifier according to another embodiment of the invention.

FIG. 8 shows a hybrid power module 600 for supplying power to a power amplifier (e.g. 140 of FIG. 1) according to another embodiment of the invention. Compared to the hybrid power module 500 of FIG. 7, the hybrid power module 600 further comprises an inductor L2 coupled between the capacitor C2 and the linear regulator 210. In the embodiment, the inductor L1 is larger than the inductor L2, and the capacitor C1 is larger than the capacitor C2. In one embodiment, the inductor L2 is a parasitic inductor formed by layout wires.

Figure 9:
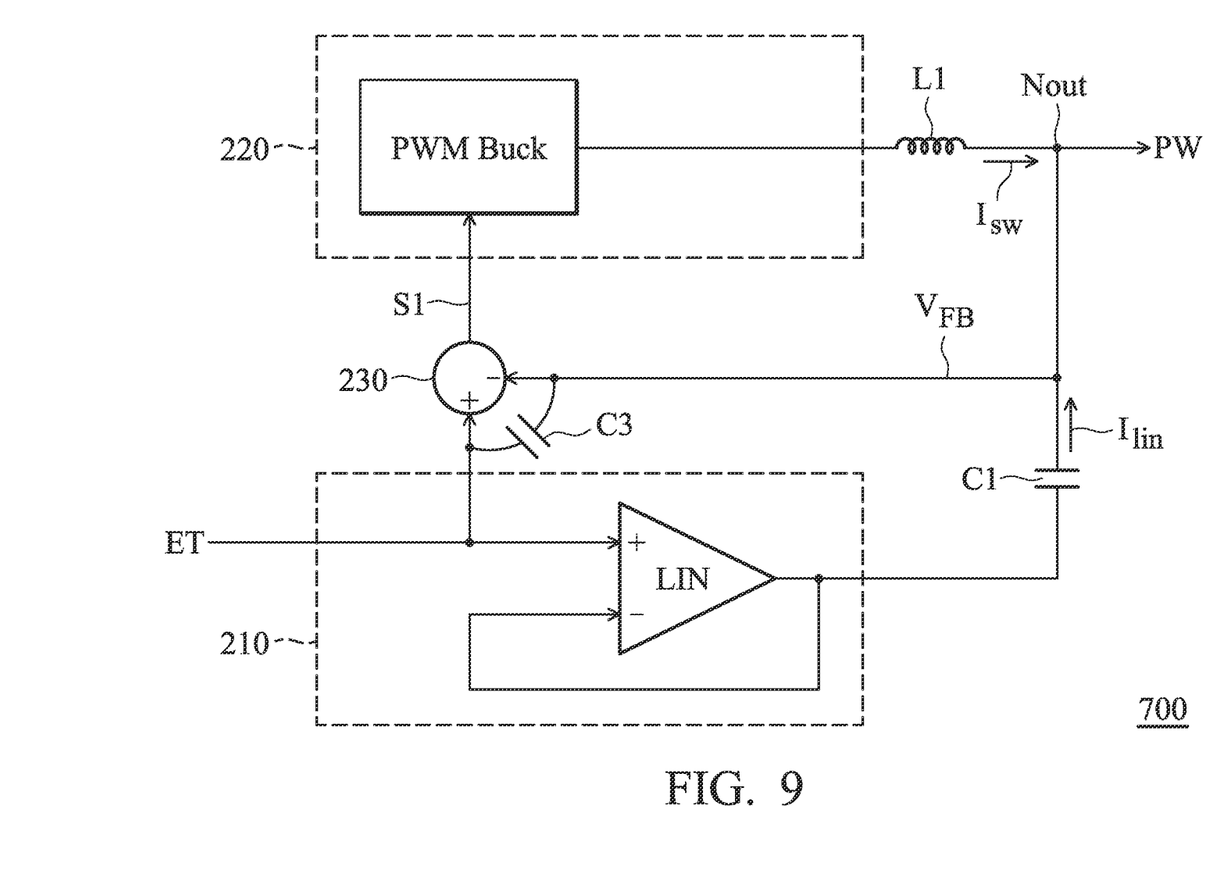
FIG. 9 shows a hybrid power module for supplying power to a power amplifier according to another embodiment of the invention.

FIG. 9 shows a hybrid power module 700 for supplying power to a power amplifier (e.g. 140 of FIG. 1) according to another embodiment of the invention. Compared to the hybrid power module 200 of FIG. 3, the hybrid power module 700 further comprises a coupling capacitor C3 coupled between the two input terminals of the subtractor 230. Through the coupling capacitor C3, the envelope tracking signal ET and a noise of the feedback signal $V_{FB}$ caused by the DC-DC converter 220 are coupling.

Figure 10:
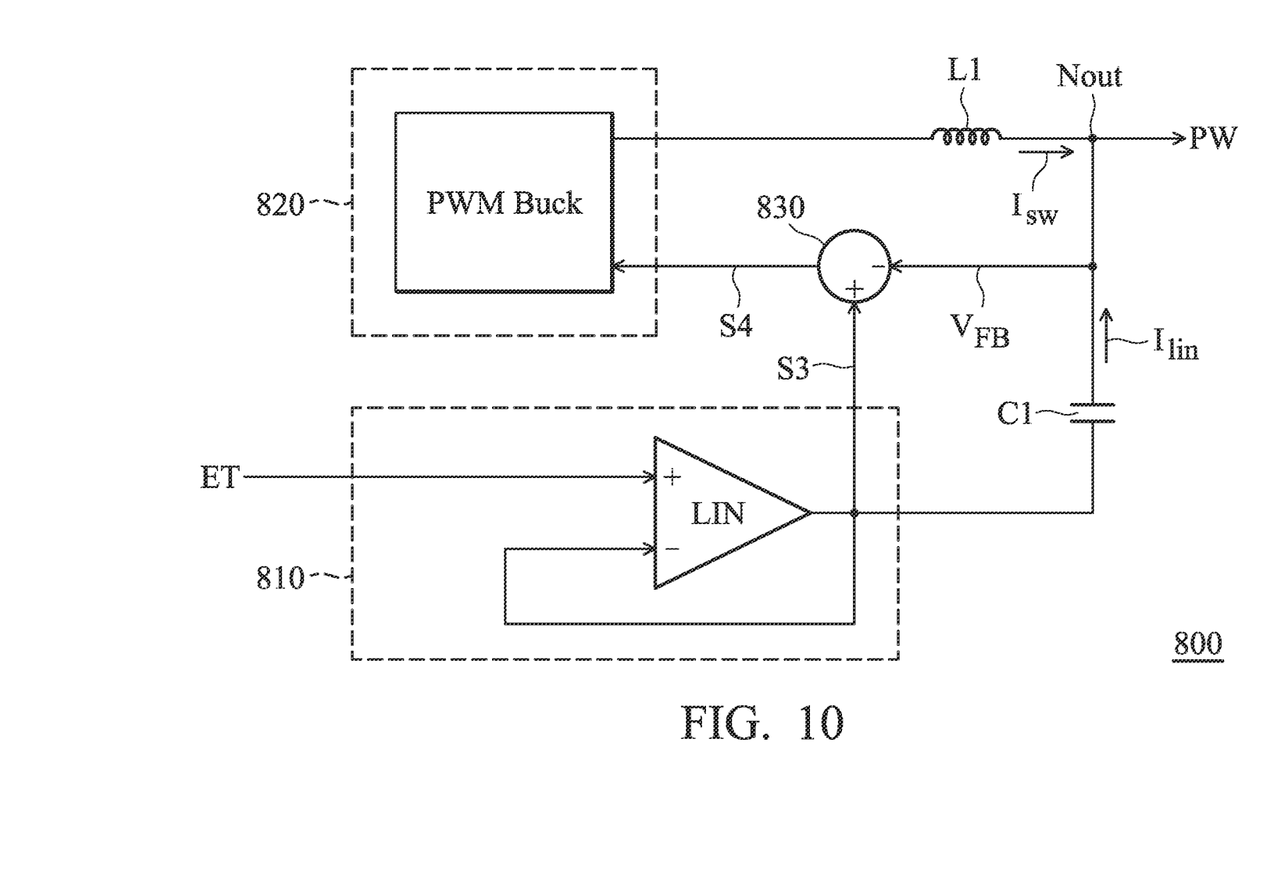
FIG. 10 shows a hybrid power module for supplying power to a power amplifier according to another embodiment of the invention.

FIG. 10 shows a hybrid power module 800 for supplying power to a power amplifier (e.g. 140 of FIG. 1) according to another embodiment of the invention. The hybrid power module 800 comprises a linear regulator 810, a DC-DC converter 820, a subtractor 830, an inductor L1 and a capacitor C1. The linear regulator 810 is capable of eliminating the switch-mode power supply (SMPS) ripple voltages caused by the DC-DC converter 820, i.e. provides an AC ground, wherein the hybrid power module 800 provides the power PW to the power amplifier as a supply power. The linear regulator 810 provides a current $I_{lin}$ to a node Nout via the capacitor C1 and a signal S3 to the subtractor 830 according to the envelope signal ET and the voltage VBAT from the battery 180 of FIG. 1. The subtractor 830 subtracts a feedback signal $V_{FB}$ corresponding to the power PW from the signal S3, to provide a signal S4 to the DC-DC converter 820. The DC-DC converter 820 is a high switching frequency DC-DC converter, which is capable of responding to load variations. In the embodiment, the DC-DC converter 820 is a pulse width modulation buck converter. The DC-DC converter 820 provides a current $I_{sw}$ to the node Nout via the inductor L1 according to the signal S4. Thus, the power PW formed by the current $I_{lin}$, the current $I_{sw}$ and a loading of the power amplifier are provided to the power amplifier. It is to be noted that a SMPS ripple voltage caused by an operating frequency of the DC-DC converter 820 (i.e. the switching frequency) is reduced by the linear regulator 810. Furthermore, the linear regulator 810 provides an AC ground for the DC-DC converter 820 via the capacitor C1. As described above, the hybrid power module 800 may further comprise a compensation unit (e.g. 310 of FIG. 5) coupled between the subtractor 830 and the node Nout for adding an offset voltage $V_{offset}$ into the feedback signal $V_{FB}$. Furthermore, the hybrid power module 800 may further comprise a current generating unit (e.g. 410 of FIG. 4) coupled to the node Nout for providing a current Ir to the node Nout, wherein the current $I_r$ and the current $I_{sw}$ are out of phase with the ?. Moreover, the hybrid power module 800 may further comprise a capacitor C2 (e.g. C2 of FIG. 7) coupled between the capacitor C1 and the ground GND, or an inductor L2 coupled between the capacitor C2 and the linear regulator 210. Furthermore, the hybrid power module 800 may further comprise a coupling capacitor C3 coupled between the two input terminals of the subtractor 830.

In general, the hybrid power module can improve both system efficiency and transient performance, wherein a buck converter of the hybrid power module supplies the DC component and a linear amplifier of the power module supplies the AC component. According to the embodiments, the DC-DC converter (220 of FIG. 3 or 820 of FIG. 10) responds to most of the part of the AC component, and the linear regulator (210 of FIG. 3 or 810 of FIG. 10) provides the AC ground for fast tracking and achieves smaller ripple without redesigning the LC filter.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hybrid power module for supplying a power to a power amplifier, comprising:
    a DC-DC converter, providing a first current to the power amplifier via a first inductor according to an operating frequency and an envelope tracking signal;
    a linear regulator, providing a second current to the power amplifier via a first capacitor according to the envelope tracking signal;
    a subtractor, comprising a first input terminal for receiving the envelope tracking signal and a second input terminal for receiving a feedback signal corresponding to the power; and
    a current generating unit coupled to the first inductor and the first capacitor, providing a third current to the power amplifier,
    wherein a switch-mode power supply (SMPS) ripple voltage caused by the DC-DC converter is reduced by the linear regulator,
    wherein the subtractor subtracts the feedback signal from the envelope tracking signal, to provide a first signal to the DC-DC converter, and the DC-DC converter provides the first current according to the operating frequency and the first signal.

2. The hybrid power module as claimed in claim 1, further comprising:
    a compensation unit coupled between the subtractor and the power amplifier, adding an offset voltage into the feedback signal.

3. A hybrid power module for supplying a power to a power amplifier, comprising:
    a DC-DC converter, providing a first current to the power amplifier via a first inductor according to an operating frequency and an envelope tracking signal;
    a linear regulator, providing a second current to the power amplifier via a first capacitor according to the envelope tracking signal;
    a subtractor, comprising a first input terminal for receiving the envelope tracking signal and a second input terminal for receiving a feedback signal corresponding to the power; and
    a second capacitor coupled between a ground and the first capacitor
    wherein a switch-mode power supply (SMPS) ripple voltage caused by the DC-DC converter is reduced by the linear regulator,
    wherein the subtractor subtracts the feedback signal from the envelope tracking signal, to provide a first signal to the DC-DC converter, and the DC-DC converter provides the first current according to the operating frequency and the first signal.

4. The hybrid power module as claimed in claim 3, further comprising:
    a second inductor coupled between the second capacitor and the linear regulator.

5. The hybrid power module as claimed in claim 4, wherein the first inductor is larger than the second inductor, and the first capacitor is larger than the second capacitor.

6. A hybrid power module for supplying a power to a power amplifier, comprising:
    a DC-DC converter, providing a first current to the power amplifier via a first inductor according to an operating frequency and an envelope tracking signal;
    a linear regulator, providing a second current to the power amplifier via a first capacitor according to the envelope tracking signal;
    a subtractor, comprising a first input terminal for receiving the envelope tracking signal and a second input terminal for receiving a feedback signal corresponding to the power; and
    a coupling capacitor coupled between the first and second input terminals of the subtractor,
    wherein a switch-mode power supply (SMPS) ripple voltage caused by the DC-DC converter is reduced by the linear regulator,
    wherein the subtractor subtracts the feedback signal from the envelope tracking signal, to provide a first signal to the DC-DC converter, and the DC-DC converter provides the first current according to the operating frequency and the first signal.

7. A hybrid power module for providing a power to a power amplifier, comprising:
    a DC-DC converter, providing a first current to the power amplifier via a first inductor according to an operating frequency and a first signal;
    a linear regulator, providing a second current to the power amplifier via a first capacitor and providing the first signal to the DC-DC converter according to an envelope tracking signal;

a subtractor, comprising a first input terminal for receiving the first signal from the liner regulator and a second input terminal for receiving a feedback signal corresponding to the power; and a current generating unit coupled to the first inductor and the first capacitor, providing a third current to the power amplifier, wherein a switch-mode power supply (SMPS) ripple voltage caused by the DC-DC converter is reduced by the linear regulator, wherein the subtractor subtracts the feedback signal from the first signal to provide a second signal, and the DC-DC converter provides the first current according to the operating frequency and the second signal.

8. The hybrid power module as claimed in claim 6, further comprising:

a compensation unit coupled between the subtractor and the power amplifier, adding an offset voltage into the feedback signal.

\* \* \* \* \*